(12) United States Patent
Onishi

(10) Patent No.: US 6,881,643 B2
(45) Date of Patent: Apr. 19, 2005

(54) SEMICONDUCTOR DEVICE PRODUCING METHOD AND SEMICONDUCTOR DEVICE

(75) Inventor: Shigeo Onishi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 214 days.

(21) Appl. No.: 09/834,923

(22) Filed: Apr. 16, 2001

(65) Prior Publication Data

US 2001/0035552 A1 Nov. 1, 2001

(30) Foreign Application Priority Data

Apr. 27, 2000 (JP) ........................................ 2000-127349

(51) Int. Cl.$^7$ ................................................. H01L 21/20
(52) U.S. Cl. ..................... 438/397; 438/253; 438/254; 438/244; 438/387; 438/396
(58) Field of Search ................................. 438/253, 254, 438/244, 387, 396, 397, 627, 648, 654, 240, 256, 399, 398, 242, 245, 388; 257/303, 310

(56) References Cited

U.S. PATENT DOCUMENTS

| | | | |
|---|---|---|---|
| 5,392,189 A | 2/1995 | Fazan et al. | |
| 5,418,388 A | 5/1995 | Okudaira et al. | 257/295 |
| 5,656,852 A | * 8/1997 | Nishioka et al. | 257/632 |
| 6,043,529 A | 3/2000 | Harner et al. | |
| 6,153,460 A | 11/2000 | Ohnishi et al. | 438/238 |
| 6,335,241 B1 | * 1/2002 | Hieda et al. | 438/253 |
| 6,344,413 B1 | * 2/2002 | Zurcher et al. | 438/678 |

FOREIGN PATENT DOCUMENTS

| | | |
|---|---|---|
| DE | 196 40 246 A1 | 4/1998 |
| EP | 0 629 002 A1 | 12/1994 |
| EP | 0 872 880 A2 | 10/1998 |
| EP | 0 889 519 A2 | 1/1999 |
| EP | 1 017 096 A2 | 7/2000 |
| JP | 7-014993 | 5/1995 |
| JP | 2000-196039 | 7/2000 |

* cited by examiner

Primary Examiner—George Fourson
Assistant Examiner—Julio J. Maldonado
(74) Attorney, Agent, or Firm—Nixon & Vanderhye P.C.

(57) ABSTRACT

In a semiconductor device producing method, a plug is formed within a contact hole formed in a barrier film and an interlayer insulating film on a semiconductor substrate. Then, an insulation film is formed on the plug and barrier film, and a hole is made in the insulation film such that an upper surface of the plug is exposed. A first conductive film is formed on the insulation film so as to fill the hole, and then etched by a CMP method to form a lower electrode within the hole. The insulation film is removed and the lower electrode is left in a protuberant manner. A dielectric film made of a ferroelectric or high-dielectric-constant substance and a second conductive film are sequentially formed over the lower electrode and the barrier film, and then patterned simultaneously to thereby form a capacitor dielectric film and an upper electrode.

9 Claims, 4 Drawing Sheets

SEMICONDUCTOR DEVICE PRODUCING METHOD AND SEMICONDUCTOR DEVICE

BACKGROUND OF THE INVENTION

The present invention relates to a semiconductor device such as a ferroelectric memory cell, a DRAM, and the like and a method of producing the semiconductor device, and more particularly, to a method of forming a microscale capacitor for such a semiconductor device.

As the semiconductor device, a ferroelectric memory cell having a one-transistor/one-capacitor structure is known. In the ferroelectric memory cell, a planar capacitor is formed over a transistor with an insulating film interposed therebetween. The transistor and the capacitor are completely isolated from each other. Therefore, after the capacitor is formed on the insulating film, the transistor and the capacitor are connected to each other locally with wiring. However, the memory cell with this structure occupies a large area and is unsuitable for achieving high packing densities or integration.

To solve the problem, there has been proposed a ferroelectric memory cell having a structure as shown in FIG. 3 in which a plug 102 made of polysilicon or TaSiN is formed on a source region 101 of a MOSFET 110 and a stacked capacitor is formed over the plug 102. In FIG. 3, reference numeral 103 denotes a barrier metal formed on the plug 102. Reference numeral 104 denotes a lower electrode, reference numeral 105 denotes a ferroelectric film, reference numeral 106 denotes an upper electrode, reference numeral 107 denotes a drive line, and reference numeral 111 denotes a metal wiring.

In the structure of the ferroelectric memory cell shown in FIG. 3, flat films to become the lower electrode 104, the ferroelectric film 105, and the upper electrode 106 are sequentially stacked on the plug 102 and an insulating film 100 and etched altogether to form a capacitor. The effective area of the capacitor is limited to the area of a flat part. Therefore, the ferroelectric memory cell is incapable of having a sufficient capacitor area if the memory cell has an area as small as less than a quarter micron.

As a solution to the above problem, as shown in FIG. 4, there has been provided a structure for a ferroelectric memory cell and a DRAM in which a plug 204 of polysilicon or tungsten is formed on a source region 201 of a MOSFET 210 formed on a silicon substrate 200, and a stacked capacitor Cp is formed on the plug 204.

The stacked capacitor structure shown in FIG. 4 is formed by the following method on a semiconductor substrate formed with a MOSFET 210, interlayer insulating films 202 and 203 on the MOSFET 210, and a plug 204 in a contact hole 202a of the interlayer insulating films 202 and 203. A conductive film of Ir, $IrO_2/Ir$, Pt, Ru, or $RuO_2/Ru$ is deposited on the plug 204 and then patterned by dry etching to form a lower electrode 205 (node electrode). Thereafter, a ferroelectric (e.g., PZT: lead zirconate titanate, SBT: strontium bismuth tantalate) or a high dielectric constant film (e.g., BST: barium strontium titanate) is deposited so as to cover the lower electrode 205. Then, a conductive film of Ir, $IrO_2$, Pt, Ru, or $RuO_2$, which will become an upper electrode, is deposited on the ferroelectric or high dielectric constant film. Thereafter, the conductive film and the ferroelectric film (or the high-dielectric-constant film) are patterned by the dry etching to form a common plate (or a drive line) consisting of the lower electrode 205, the ferroelectric (or high dielectric constant) film 206, and the upper electrode 206.

In the above stacked capacitor structure, if the lower electrode 205 is formed to be large in thickness to increase the area of the capacitor, then the etching process takes long because of a low etching rate proper to the dry etching method. Further, the conductive film made of Pt, Ir or $IrO_2$, which is used to form the lower electrode 205 or the upper electrode 207, has a low reactivity with a halogenating gas ordinarily used in the dry etching process. Further, because its reaction product has a low volatility, the etching rate of the conductive film is low. Thus the stacked capacitor structure has a problem that it is difficult to perform microprocessing. The stacked capacitor structure has another problem that because the influence of a micro-loading effect is great in the case of a pattern of the order of less than submicron, the reaction product adheres to the conductive film and particles are developed on the conductive film.

To solve the problem, Sharp K. K. has proposed a semiconductor device with a three-dimensional capacitor structure capable of increasing the effective capacitor area (Japanese Patent Application Laid-open No. 2000-196039). This semiconductor device will be described below merely for the better understanding of the present invention although it is not a prior art to the present invention.

In producing the semiconductor device having the three-dimensional capacitor structure, as shown in FIG. 5, a plug 302 is formed in an interlayer insulating film 300 formed on a source region 301, and a buried barrier metal 303 is formed on the plug 302. After the plug 302 with buried barrier metal 303 was formed, an insulating film 310 is deposited and then grooved at 310a. Then, an electrode film is deposited on the insulating film 310 including inside of the groove 310a and then processed by the chemical mechanical polishing (CMP) method to thereby form a capacitor lower electrode 304. With this method of producing the semiconductor device, even side surfaces of the lower electrode 304 are used as part of a capacitor. Thus the capacitor has an increased area. But according to the three-dimensional capacitor structure shown in FIG. 5, with reduction of the design rule, the groove is made finer. Accordingly, it will be difficult to form the lower electrode, the ferroelectric film, and the upper electrode within the groove.

SUMMARY OF THE INVENTION

Therefore, it is an object of the present invention to provide a semiconductor device having a micro-capacitor structure capable of addressing the increased packing densities and a method of producing a semiconductor device by which such a micro-capacitor structure is easily achieved.

In order to achieve the above object, a method of producing a semiconductor device according to an aspect of the invention comprises:

sequentially forming an interlayer insulating film and a barrier film on a semiconductor substrate;

making a contact hole in the barrier film and the interlayer insulating film and forming a plug within the contact hole;

forming an insulation film on the plug and the barrier film and then forming a hole leading to the plug in the insulation film such that an upper surface of the plug is exposed;.

forming a first conductive film on the insulation film such that the hole is filled with the first conductive film, and then etching the first conductive film by a chemical mechanical polishing method to thereby form a lower electrode within the hole;

etching the insulation film until the barrier film is exposed, so as to leave the lower electrode in a protuberant manner;

forming a dielectric film that covers the protuberant lower electrode and the barrier film, and then forming a second conductive film that covers the dielectric film, said dielectric film being made of a ferroelectric or high-dielectric-constant substance; and patterning the dielectric film and the second conductive film simultaneously to thereby form a capacitor dielectric film and an upper electrode. A capacitor is constituted of the thus formed lower electrode, capacitor dielectric film and upper electrode.

In the method with the above process steps, a protuberant lower electrode having a sufficiently large height is achieved through the short-time etch-back of the insulation film by the CMP method and without using dry etching. In addition, because all of the upper and side surfaces of the thus achieved protuberant lower electrode are covered with the dielectric film and the upper electrode, the capacitor area is increased by the area of all the side surfaces of the lower electrode. Because the shape and size of the lower electrode is controlled by controlling the thickness of the insulation film and the shape and size of the hole, it is easy to obtain a narrow but high lower electrode. In addition, unlike the technique shown in FIG. 5, the dielectric film and the upper electrode are formed not inside of the lower electrode, but outside of it. Accordingly, it is possible to easily fabricate a very fine capacitor capable of accommodating to the increase in the packing densities, without reducing the capacitor area. Therefore, even though the hole formed in the insulation film is made very fine with reduction of the design rule, it is possible to form a three-dimensional capacitor having a sufficiently large capacitor area. Accordingly, it is possible to easily form a very fine capacitor coping with high integration and thus provide a ferroelectric memory cell enabling a DRAM level packing density.

A method of producing a semiconductor device according to another aspect of the invention comprises:

sequentially forming an interlayer insulating film and a barrier film on a semiconductor substrate;

making a contact hole in the barrier film and the interlayer insulating film and forming a plug within the contact hole;

forming a first insulation film on the plug and the barrier film and then forming a hole leading to the plug in the first insulation film such that an upper surface of the plug is exposed;

forming a first conductive film over the first insulation film and within the hole such that the first conductive film within the hole does not fill the hole but covers surfaces defining the hole, and then forming a second insulation film on the first conductive film so as to fill the hole;

etching the second insulation film until an upper surface of the first conductive film is reached, and then etching the first conductive film and the second insulation film in the hole by a chemical mechanical polishing method until the first insulation film is exposed, to thereby form a cup-shaped lower electrode within the hole;

etching the first insulation film and the second insulation film within the hole until the barrier film and the lower electrode are exposed;

forming a dielectric film over the cup-shaped lower electrode such that the dielectric film covers inner and outer peripheries and an inner bottom surface of the cup-shaped lower electrode, and then forming a second conductive film that covers the dielectric film, the dielectric film being made of a ferroelectric or high-dielectric-constant substance; and patterning the dielectric film and the second conductive film simultaneously to thereby form a capacitor dielectric film and an upper electrode. A capacitor is constituted of the thus formed lower electrode, capacitor dielectric film and upper electrode.

The shape of the "cup" includes shapes of a circle and polygons, such as a rectangle, in section.

In the method with the above process steps, a cud-shaped lower electrode having a sufficiently large height is achieved through the short-time etch-back of the first insulation film and the second insulation film (within the hole) by the CMP method and without using dry etching. In addition, because all of the inner and outer peripheries and the inner bottom surface of the thus achieved cup-shaped lower electrode are covered with the capacitor dielectric film and the upper electrode, a sufficiently large capacitor area is achieved. Because the shape and size of the lower electrode is controlled by controlling the thickness of the first insulation film and the shape and size of the hole, it is easy to obtain a narrow but high lower electrode.

The second conductive film may be formed such that a gap defined between opposite surfaces of the dielectric film within the hole is filled with a part of the second conductive film. Therefore, even though the hole formed in the first insulation film is made very fine with reduction of the design rule, it is possible to form a three-dimensional capacitor having a sufficiently large capacitor area. Accordingly, it is possible to easily form a very fine capacitor coping with high integration and thus provide a ferroelectric memory cell enabling a DRAM level packing density.

The etch-back of the second insulation film until the upper surface of the first conductive film is reached may be performed by using the dry etching or CMP method.

In either method of the present invention, if the barrier film is made of $TiO_2$, $Al_2O_3$, or SiN, the barrier film well prevents a reaction between the dielectric film (capacitor dielectric film) and the interlayer insulating film.

In either method of the present invention, the plug may be formed such that the plug has a buried barrier metal in a top portion thereof. The plug proper may be made of, for example, an $n^+$doped silicon, and the buried barrier metal maybe made of, for example, materials containing TaSiN or $Ir/IrO_2$.

In either method of the present invention, the first and second conductive films may be made or iridium (Ir), platinum (Pt) or any other suitable material.

Either method of the present invention may further comprise, after forming the insulation film (the first insulation film), forming a Ti film or a $TiO_2$ film on the insulation film (the first insulation film). Such a film provides for good adhesion between the insulation film (the first insulation film) and the first conductive film. Thus, a semiconductor device produced can offer high reliability.

A semiconductor device according to a further aspect of the invention comprises:

an interlayer insulating film formed on a semiconductor substrate;

a barrier film formed on the interlayer insulating film;

a contact hole made in the barrier film and the interlayer insulating film;

a plug formed within the contact hole and having a barrier metal buried in an upper portion thereof;

a cup-shaped lower electrode opening upward, said cup-shaped lower electrode being positioned on the barrier film and the contact hole;

a dielectric film made of a ferroelectric or high-dielectric-constant substance, said dielectric film covering inner and outer peripheries and an inner bottom surface of the cup-shaped lower electrode; and an upper electrode covering the dielectric film, the lower electrode, the dielectric film and the upper electrode constituting a capacitor.

The capacitor of the semiconductor device can be fabricated by the above-mentioned second method of the present invention. Thus, as is obvious from the foregoing explanation, the capacitor has a sufficiently large effective capacitor area. Accordingly if the semiconductor device having such a capacitor is used as a memory cell, a highly integrated memory is achieved.

BRIEF DESCRIPTION OF THE DRAWINGS

The present invention will become more fully understood from the detailed description given hereinbelow and the accompanying drawings which are given by way of illustration only, and thus are not limitative of the present invention, and therein.

DETAILED DESCRIPTION OF THE PREFERRED EMBODIMENTS

First Embodiment

FIGS. 1A through 1E are sectional views of essential parts, showing steps of a semiconductor device production process according to a first embodiment of the present invention.

Figure 1A:
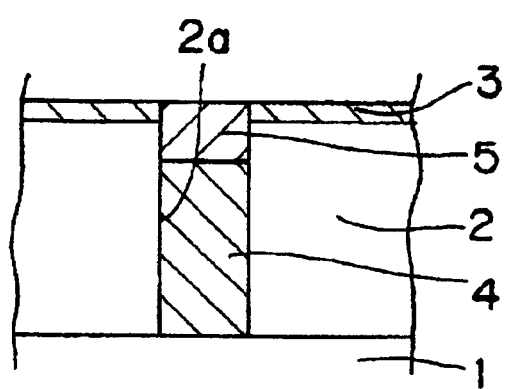
FIGS. 1A, 1B, 1C, 1D, and 1E are sectional views of essential parts, showing steps of a semiconductor device production process according to a first embodiment of the present invention.

As shown in FIG. 1A, $SiO_2$ is deposited on a silicon substrate 1 on which transistors (not shown) have been formed, to form an interlayer insulating film 2 having a thickness of about 1–1.5 $\mu$m Thereafter, $TiO_2$, $Al_2O_3$ or SiN is deposited on the interlayer insulating film 2 to form an underlying barrier film 3 having a thickness of about 0.05–0.2 $\mu$m. The underlying barrier film 3 fundamentally serves to prevent the reaction between a ferroelectric film and the $SiO_2$ film 2.

Next, after a contact hole 2a is formed in the interlayer insulating film 2 and the underlying barrier film 3, doped polysilicon is deposited to the thickness of about 0.1–0.5 $\mu$m over the entire surface of the substrate. Thereafter, the doped silicon is etched by a RIE (reactive ion etching) method until the doped silicon on the barrier film 3 is entirely removed and the doped silicon remains only in the contact hole 2a. Thus, a plug 4 is formed in the contact hole 2a. At this time, a recess is formed by over-etching the plug 4 from its upper surface in a depth of 0.2–0.3 $\mu$m.

A barrier metal composed of a TaSiN/Ti film (total thickness: 0.1–0.3 $\mu$m) is deposited on the plug 4 by the sputtering method or CVD (chemical vapor deposition) method. Thereafter, the barrier metal deposited is leveled or flattened by the CMP method to form a buried barrier metal 5 in the plug 4. As a result, a plug 4 with a buried barrier metal is completed. At this time, it is necessary to leave the underlying barrier film 3 made of $TiO_2$, $Al_2O_3$ or SiN. As the material for the barrier metal, it is also possible to use $Ir/IrO_2$ or $Ir/IrO_2/TaSiN$.

Figure 1B:
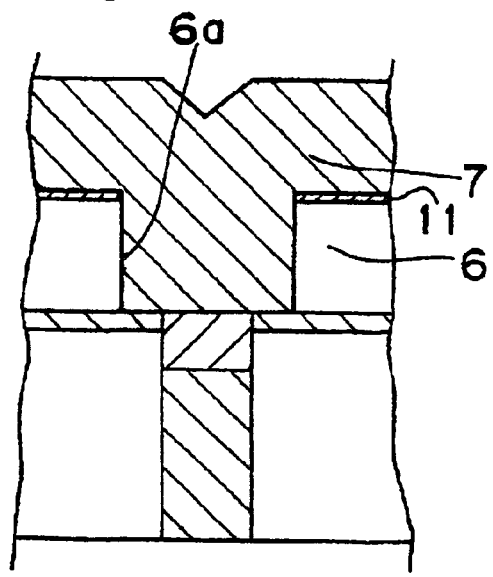

Thereafter, as shown in FIG. 1B, a $SiO_2$ film 6 serving as an insulating film is deposited to a thickness of 0.2–1.0 $\mu$m on the plug 4 and the underlying barrier film 3. Then, an approximately rectangular region above the plug 4 is removed from the $SiO_2$ film 6 by, for example, the RIE method. The etching is performed until the embedded barrier metal 5 and the underlying barrier film 3 part surrounding the embedded barrier metal 5 are exposed. As a result, a rectangular hole 6a is formed in the $SiO_2$ film 6. To enhance the adhesion of the $SiO_2$ film 6 to a lower electrode which will be described later, a Ti or $TiO_2$ film 11 having a thickness of 0.02–0.05 $\mu$m is formed on the upper surface of the $SiO_2$ film 6 before the hole 6a is formed in the embodiment. However, the Ti or $TiO_2$ film 11 does not necessarily have to be formed.

Thereafter, to form a lower electrode, an Ir film 7 serving as a first conductive film is deposited to the thickness of about 0.05–0.5 $\mu$m over the film 11 such that the hole 6a is filled with the Ir film 7. The Ir film 7 is formed by thermally decomposing an iridium organic metal complex having a relatively high vapor pressure. In the case where the hole 6a is narrow, the Ir film 7 may be formed by the sputtering method. A Pt film may be used instead of the Ir film 7.

Figure 1C:
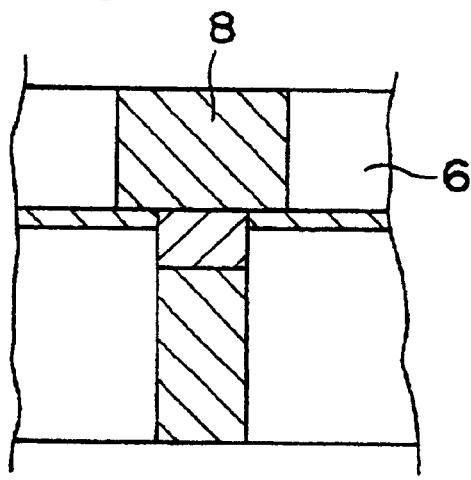

Thereafter, as shown in FIG. 1C, the Ir film 7 and the film 11 are polished by the CMP method until the $SiO_2$ film 6 is exposed to thereby form the Ir lower electrode 8 filling in the hole 6a. The CMP method is a technique of polishing mechanically and chemically using slurry consisting of a mixture of a polishing agent such as $CeO_2$, $ZrO_2$ or $Al_2O_3$ and an acid or alkaline solution dissolving or biting Ir or Pt.

Figure 1D:
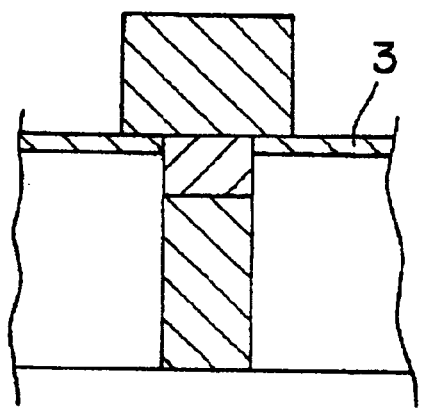

Thereafter, the $SiO_2$ film 6 (shown in FIG. 1C) is etched back with an ordinary oxide film RIE (reactive ion etching) device until the underlying barrier film 3 ($Al_2O_3$, $TiO_2$ or SiN) is exposed. As a result, the approximately rectangular parallelopiped-shaped lower electrode 8 appears on the plug 4 (more precisely, on the buried barrier metal of the plug 4) and the underlying barrier film 3, as shown in FIG. 1D. It is advisable that the underlying barrier film 3 at this stage is left in a thickness of about 0.03–0.15 $\mu$m.

Figure 1E:
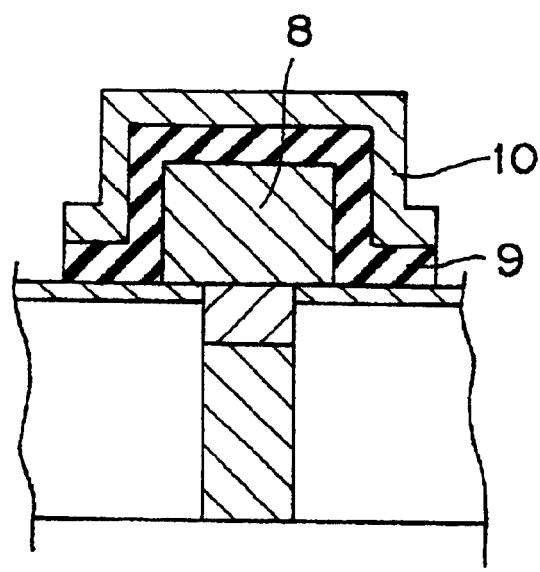

Finally, as shown in FIG. 1E, SBT and Ir are sequentially deposited over the lower electrode 8 and the underlying barrier film 3 by the MOCVD (metal organic chemical vapor deposition) method to form an SBT film 9 with a thickness of 0.05–0.3 $\mu$m serving as a dielectric film and an Ir upper electrode 10 with a thickness of 0.05–0.3 $\mu$m serving as a second conductive film. Thereafter, the SBT film 9 and the upper electrode 10 are etched altogether by the dry etching method to complete a protuberant three-dimensional capacitor as shown in FIG. 8. As compared by a capacitor whose capacitor area is defined by only an upper surface of its lower electrode, the thus formed capacitor of the first embodiment has a larger capacitor area by an amount corresponding to the total area of the side surfaces of the lower electrode 8. As is obvious, the total area of side surfaces of the lower electrode 8 is controlled by controlling the film thickness of the $SiO_2$ film 6 (namely, the depth of the hole 6a) and the cross section of the hole 6a. This means that, even if the area of the cross section of the hole 6a is reduced, a certain area of the side surface is secured by increasing the thickness of the $SiO_2$ film 6.

Figure 4:
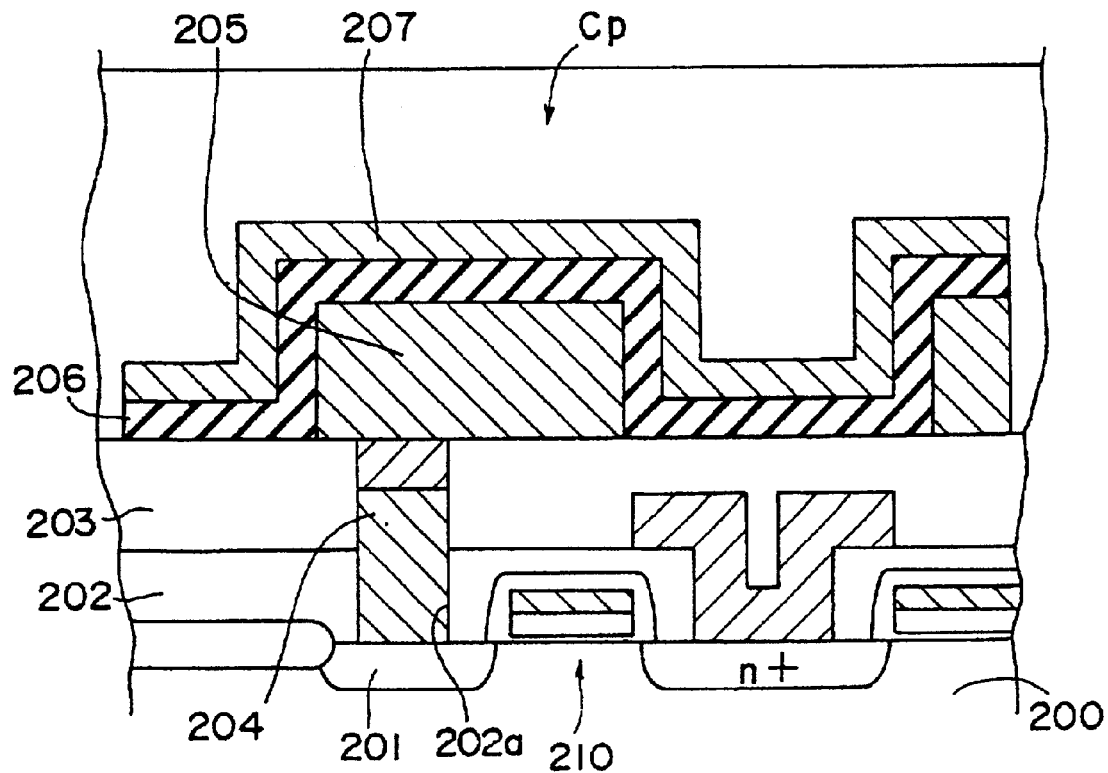
FIG. 4 is a sectional view of a conventional ferroelectric memory cell having a protuberant capacitor structure.
Figure 5:
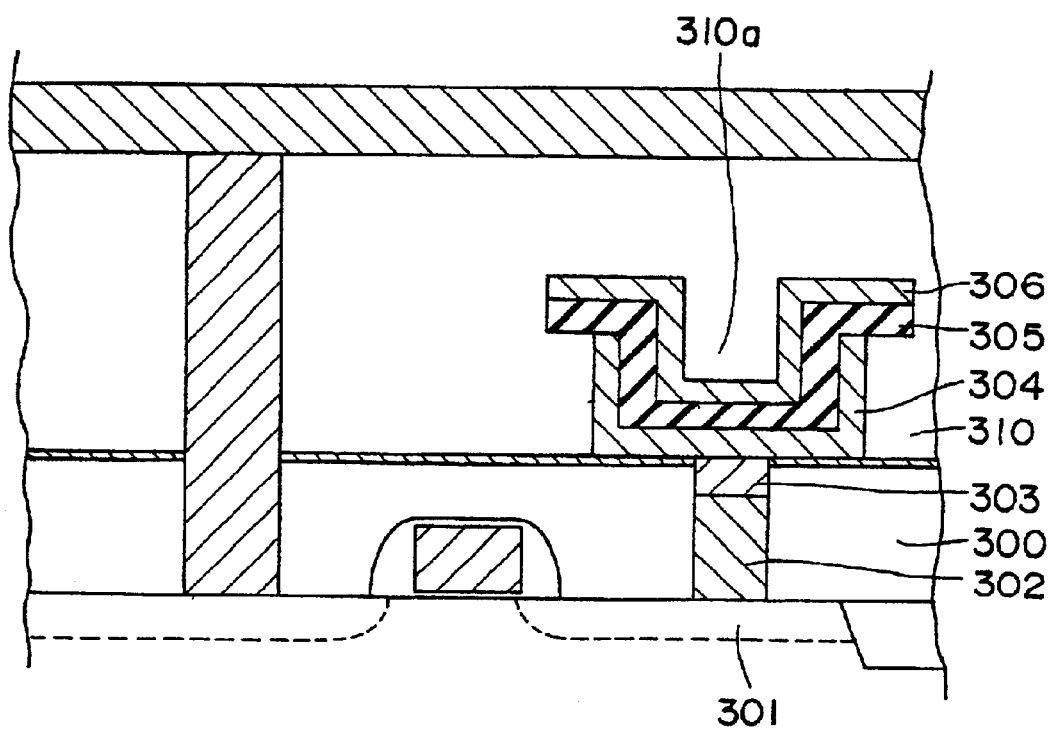
FIG. 5 is a sectional view showing the structure of a ferroelectric memory cell having a three-dimensional capacitor of related art.

Because in this embodiment the lower electrode 8 is made by filling the hole 6a of the $SiO_2$ film and without using the dry etching technique unlike the above-described method of forming the lower electrode 205 shown in FIG. 4, and the shape and size of the lower electrode 8 is controlled by controlling the thickness of the $SiO_2$ film 6 and the shape and size of the hole 6a, it is easy to obtain a narrow but high lower electrode. In addition, unlike the technique shown in FIG. 5, the dielectric film 9 and the upper electrode are formed not inside of the lower electrode 8, but outside of it.

Accordingly, it is possible to easily fabricate a very fine capacitor capable of accommodating to the increase in the packing densities, without reducing the capacitor area.

In the first embodiment, a three-dimensional capacitor having the rectangular parallelopiped-shaped lower electrode 8 is formed. However, the lower electrode may have other shapes. For example, it may have the shape of a pillar whose cross section is round or polygonal other than rectangular. In any case, the lower electrode is covered with the dielectric film (namely, a ferroelectric or high dielectric constant film) and the upper electrode.

In the first embodiment, SBT which is a ferroelectric is used as the material of dielectric film 9, and the Ir film is used as the material of the electrodes 8, 10. But PZT which is a ferroelectric material or BST which is a high dielectric constant material may be used as the dielectric film, and a Pt film or the like may be used as the material of the electrodes.

Second Embodiment

FIGS. 2A through 2F are sectional views of essential parts, showing steps of a semiconductor device production process according to a second embodiment of the present invention.

Figure 2A:
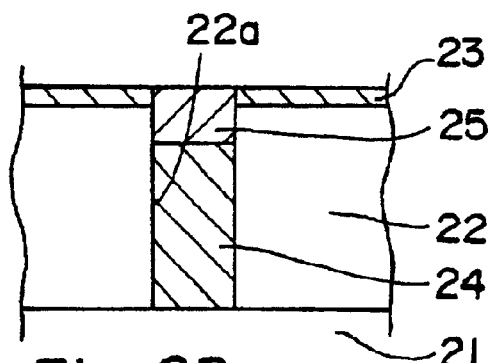
FIGS. 2A, 2B, 2C, 2D, 2E, and 2F are sectional views of essential parts, showing steps of a semiconductor device production process according to a second embodiment of the present invention.

As shown in FIG. 2A, $SiO_2$ is deposited on a silicon substrate 21 on which transistors (not shown) have been formed, to form an interlayer insulating film 22 having a thickness of about 1–1.5 $\mu$m. Thereafter, $TiO_2$, $Al_2O_3$ or SiN is deposited on the interlayer insulating film 2 to form an underlying barrier film 23 having a thickness of about 0.05–0.2 $\mu$m. The underlying barrier film 23 fundamentally serves to prevent the reaction between a ferroelectric film and the $SiO_2$ film 22.

Next, after a contact hole 22a is formed in the interlayer insulating film 22 and the underlying barrier film 23, doped polysilicon is deposited to the thickness of about 0.1–0.5 $\mu$m over the entire surface of the substrate. Thereafter, the doped silicon is etched by the RIE method until the doped silicon on the barrier film 23 is entirely removed and only the doped silicon embedded in the contact hole 22a remains. As a result, a plug 24 is formed in the contact hole 22a. At this time, a recess is formed by over-etching the plug 24 from its upper surface in a depth of 0.2–0.3 $\mu$m.

A barrier metal composed of a TaSiN/Ti film (total thickness: 0.1–0.3 $\mu$m) is deposited over the wafer by the sputtering method or CVD method. Thereafter, the barrier metal deposited is leveled or flattened by the CMP method to form a buried barrier metal 25 in the plug 24. At this time, it is necessary to leave the underlying barrier film 23 made of $TiO_2$; $Al_2O_3$ or SiN. As the material for the barrier metal, it is also possible to use $Ir/IrO_2$ or $Ir/IrO_2/TaSiN$.

Figure 2B:
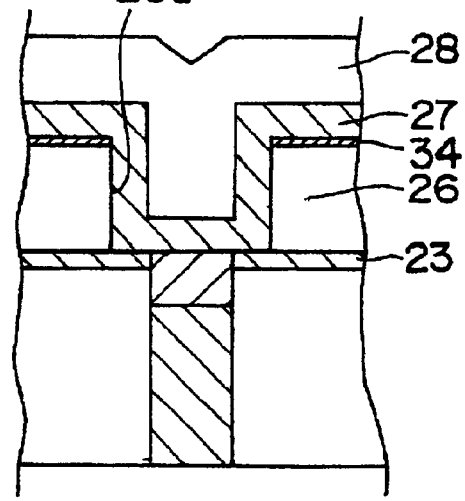

Thereafter, as shown in FIG. 2B, a $SiO_2$ film 26 serving as an insulating film is deposited to a thickness of 0.2–1.0 $\mu$m on the embedded barrier metal 25 and the underlying barrier film 23. Thereafter, an approximately circular region above the plug 4 is removed from the $SiO_2$ film 26 by, for example, the RIE method. The etching is performed until the embedded barrier metal 25 and a part of the underlying barrier film 23 surrounding the embedded barrier metal 25 are exposed. As a result, a hole 26a having a circular cross section is formed in the $SiO_2$ film 26. To enhance the adhesion of the $SiO_2$ film 26 to a lower electrode which will be described later, a Ti or $TiO_2$ film 34 having a thickness of 0.02–0.05 $\mu$m is formed on the upper surface of the $SiO_2$ film 26 before the hole 26a is formed. However, the Ti or $TiO_2$ film 34 is not essential.

So far, the process steps in the second embodiment are the same as those in the first embodiment.

Thereafter, to form a lower electrode, an Ir film 27 serving as a first conductive film is deposited to the thickness of about 0.05–0.5 $\mu$m mover the wafer surface such that exposed surfaces of the $SiO_2$ film 26 and the films 23 and 25 defining the hole 26a are covered with the Ir film 27. The Ir film 27 is formed by thermally decomposing an iridium organic metal complex having a relatively high vapor pressure. For the deposition of the Ir film, the MOCVD method or the electroplate method is used because these methods can provide a good film coating. A Pt film may be used instead of the Ir film 27.

Then, ozone-TEOS (tetraethoxysilane)-$SiO_2$ is deposited to a thickness of 0.2–0.5 $\mu$m on the Ir film 27 to form a $SiO_2$ film 28 serving as a second insulating film. The hole 26a is completely filled with the $SiO_2$ film 28.

Figure 2C:
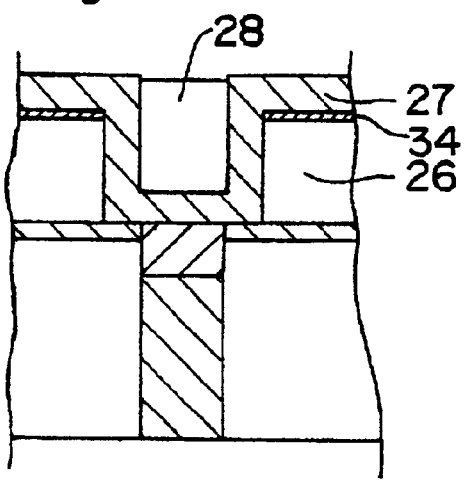

Thereafter, the $SiO_2$ film 28 (FIG. 2B) is etched back by the dry etching method until the Ir film 27 is exposed as shown in FIG. 2C. Alternatively, the CMP method may be used for the etch-back of the $SiO_2$ film 28.

Figure 2D:
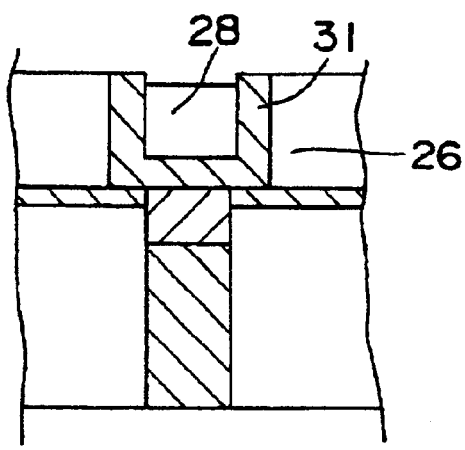

Thereafter, as shown in FIG. 2D, the Ir film 27 present outside the hole 26a and the film 34 are polished by the CMP method. As a result, the Ir film remains only in the hole 26a to thereby form a lower electrode 31. The CMP method is a technique of polishing mechanically and chemically using slurry consisting of a mixture of a polishing agent such as $CeO_2$, $ZrO_2$ or $Al_2O_3$ and an acid or alkaline solution dissolving or biting Ir or Pt.

Figure 2E:
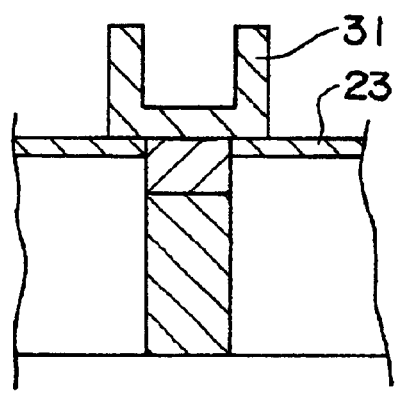

Thereafter, as shown in FIG. 2E, the $SiO_2$ film 26 is etched back with an oxide film RIE device until the underlying barrier film 23 ($Al_2O_3$, $TiO_2$ or SiN) is exposed. At the same time, the $SiO_2$ film 28 in the hole 26a is etched back until the Ir lower electrode 31 is exposed. It is desirable to leave the underlying barrier film 23 in a thickness of 0.03–0.15 $\mu$m.

Figure 2F:
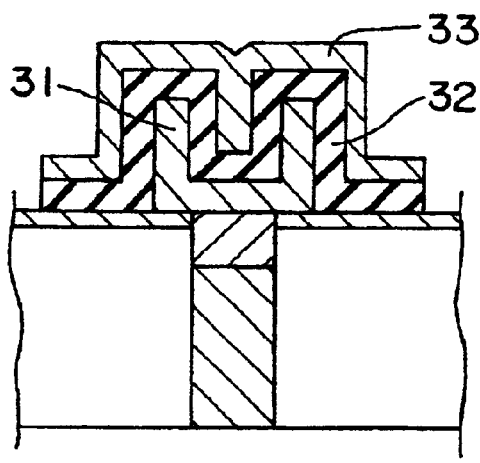
Figure 3:
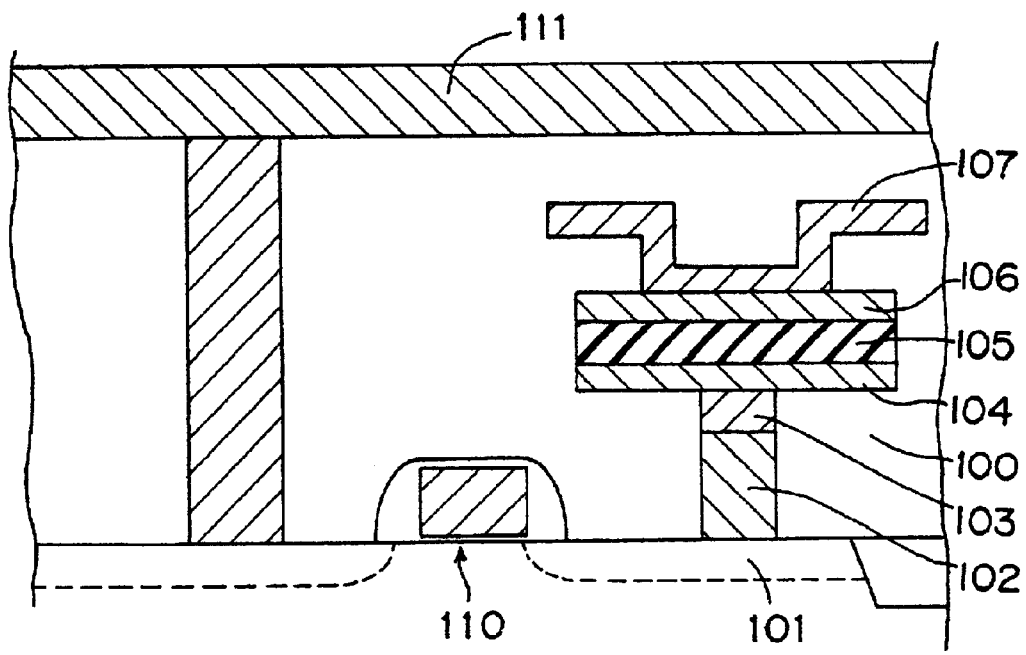
FIG. 3 is a sectional view of essential parts of a conventional ferroelectric memory cell having a stacked capacitor structure.

Finally, an SBT film and an Ir film are sequentially formed by the MOCVD method such that these films cover the lower electrode 31 and a part of the underlying barrier film 23. At this time, the Ir film is formed such that a gap defined between opposite surfaces of the SBT film within the hole 26a is filled with a part of the Ir film. The SBT film and the Ir film are then etched altogether to form an SBT film 32 serving as a capacitor dielectric film having a thickness of 0.05–0.3 $\mu$m and an Ir upper electrode 33 serving as a second conductive film having a thickness of 0.05–0.3 $\mu$m, as shown in FIG. 2F. In this manner, an annular three-dimensional capacitor consisting of the lower electrode 31, the SBT film 32, and the upper electrode 33 is completed. The annular three-dimensional capacitor provides a large capacitor area by effectively utilizing the entirety of the outer periphery, inner periphery, and inner bottom surface of the cup-shaped lower electrode 31.

By forming the protuberant three-dimensional capacitor on the silicon substrate 21 in the above-described manner, it is easy to form a very fine capacitor capable of achieving high integration, or large packing densities.

The second embodiment has been described on the three-dimensional capacitor whose lower electrode 31 has a shape of a circular cylinder with one end closed as an example of the cup shape. But the cup shape of the lower electrode is not limited to the circular cross section, but may have a polygonal cross section such as a rectangular cross section. In any case, the dielectric film 32 and the upper electrode 33 are formed such that these films cover the outer periphery, inner periphery, and inner bottom surface of the cup-shaped lower electrode 31.

In the second embodiment, SBT which is a ferroelectric material is used as the dielectric film, and Ir is used as the material of the electrodes. Alternatively, PZT which is a ferroelectric substance or BST which is a high-dielectric-constant substance may be also used as the material of the dielectric film, and a Pt film or the like may be used as the material of the electrodes.

As apparent from the foregoing description, according to the present invention, in the capacitor forming stage for the DRAM or the ferroelectric memory device having the one-transistor/one-capacitor structure, very fine three-dimensional capacitors can be easily formed by forming the protuberant or cup-shaped lower electrode having a large height, or difference in level and by covering the lower electrode sequentially with the dielectric film (namely, a high dielectric constant film or a ferroelectric film) and the upper electrode. Thus, the semiconductor device thus formed can cope with high integration.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of producing a semiconductor device, the method comprising:

sequentially forming an interlayer insulating film and a barrier film on a semiconductor substrate;

making a contact hole in the barrier film and the interlayer insulating film, and forming a plug within the contact hole;

forming an insulation film and then an adhesion film on the plug and the barrier film, and then forming a hole in the insulation film and the adhesion film leading to the plug such that an upper surface of the plug and an adjacent part of the barrier film are exposed;

forming a first conductive film on the insulation and adhesion films and on and over an exposed part of the barrier film in the hole such that the hole in the insulation film and in the adhesion film is filled with the first conductive film, and then etching the first conductive film and the adhesion film by a chemical mechanical polishing method to thereby form a lower electrode within the hole in the insulation film;

etching the insulation film until the barrier film is exposed, so as to leave the lower electrode in a protuberant manner;

wherein the adhesion film is removed before the lower electrode is left in the protuberant manner;

forming a dielectric film that covers the protuberant lower electrode and at least part of the barrier film, and then forming a second conductive film that covers at least part of the dielectric film, said dielectric film being made of a ferroelectric or high-dielectric-constant substance; and patterning the dielectric film and the second conductive film simultaneously to thereby form a capacitor dielectric film and an upper electrode.

2. The method according to claim 1, wherein said barrier file is made of $TiO_2$ or $Al_2O_3$ or SiN.

3. The method of claim 1, wherein the contact hole has the same cross sectional area in both the interlayer insulating film and the barrier film.

4. The method of claim 1, wherein the dielectric film covers each of an upper surface and all side surfaces of the protuberant lower electrode.

5. A method of producing a semiconductor device, the method comprising:

sequentially forming an interlayer insulating film and a barrier film so as to be supported by a semiconductor substrate;

making a contact hole in the barrier film and the interlayer insulating film and forming a plug within the contact hole;

forming a first insulation film and then an adhesion film on the plug and the barrier film, and then forming a hole leading to the plug in the first insulation film and the adhesion film such that an upper surface of the plug is exposed;

forming a first conductive film over at least part of the first insulation film and adhesion film and within the hole such that the first conductive film within the hole does not fill the hole but covers surfaces defining the hole, and then forming a second insulation film on the first conductive film so as to fill the hole;

etching the second insulation film until an upper surface of the first conductive film is reached, and then etching the first conductive films the adhesion film, and the second insulation film in the hole by a chemical mechanical polishing method until the first insulation film is exposed, to thereby form a cup-shaped lower electrode within the hole;

etching the first insulation film and the second insulation film within the hole until the barrier film and the lower electrode are exposed, respectively;

forming a dielectric film over the cup-shaped lower electrode such that the dielectric film covers inner and outer peripheries and an inner bottom surface of the cup-shaped lower electrode, and then forming a second conductive film that covers the dielectric film, said dielectric film being made of a ferroelectric or high-dielectric-constant substance; and patterning the dielectric film and the second conductive film simultaneously to thereby form a capacitor dielectric film and an upper electrode.

6. The method according to claim 5, wherein said barrier film is made of $TiO_2$ or $Al_2O_3$ or SiN.

7. The method according to claim 5, wherein the second conductive film is formed such that a gap defined, between opposite surfaces of the dielectric film within the hole is filled with a part of the second conductive film.

8. The method according to claim 5, wherein a part of the upper electrode fills a gap defined between opposite surface of the dielectric film within the hole.

9. The method of claim 5, wherein the contact hole has the same cross sectional area in both the barrier film and the interlayer insulating film.

* * * * *